United States Patent [19]

Takamura et al.

[11] Patent Number: 5,795,803

[45] Date of Patent: Aug. 18, 1998

[54] METHOD FOR MANUFACTURING A SEMICONDUCTOR DEVICE

[75] Inventors: Yoshiji Takamura, Uda-gun; Akio Kawamura, Tenri; Katsuji Iguchi, Yamatokoriyama, all of Japan

[73] Assignee: Sharp Kabushiki Kaisha, Osaka, Japan

[21] Appl. No.: 871,680

[22] Filed: Jun. 9, 1997

[30] Foreign Application Priority Data

Aug. 29, 1996 [JP] Japan ................... 8-228901

[51] Int. Cl.⁶ .......................... H01L 21/8238
[52] U.S. Cl. .................. 438/228; 438/199; 438/225; 438/227; 438/527; 438/529
[58] Field of Search ................. 438/199, 218, 438/225, 227, 228, 527, 529

[56] References Cited

U.S. PATENT DOCUMENTS

| | | | |
|---|---|---|---|
| 4,889,825 | 12/1989 | Parrillo | 438/228 |
| 5,489,540 | 2/1996 | Liu et al. | 438/228 |
| 5,501,993 | 3/1996 | Borland. | |
| 5,654,213 | 8/1997 | Choi et al. | 438/227 |
| 5,693,505 | 12/1997 | Kobayashi | 438/228 |

FOREIGN PATENT DOCUMENTS

| | | |
|---|---|---|
| 62-254203A | 11/1987 | Japan. |
| 63-88714 | 4/1988 | Japan. |
| 02067755A | 3/1990 | Japan. |
| 02264464A | 10/1990 | Japan. |

*Primary Examiner*—Trung Dang
*Attorney, Agent, or Firm*—Nixon & Vanderhye, PC

[57] ABSTRACT

A method of manufacturing a semiconductor device comprises; forming a device isolation region in a semiconductor substrate; forming at least a first conductivity type impurity region in the semiconductor substrate; and forming on the semiconductor substrate a transistor including a gate insulating film, a gate electrode, source/drain regions and a channel located directly under the gate electrode, wherein the first conductivity type impurity region is formed by the steps of: an ion implantation 1 having a concentration peak at a location deeper than the bottom of the device isolation region; an ion implantation 2 having a concentration peak at a location around the bottom of the device isolation region; an ion implantation 3 having a concentration peak around the junction regions where the source/drain regions are to be formed; and an ion implantation 4 having a concentration peak on the surface or directly under the surface of the region where the channel is to be formed.

8 Claims, 9 Drawing Sheets

METHOD FOR MANUFACTURING A SEMICONDUCTOR DEVICE

BACKGROUND OF THE INVENTION

1. Field of the Invention

The present invention relates to a method of manufacturing semiconductor device, and more specifically, to a method of manufacturing a semiconductor device having a highly integrated CMOS circuit element.

2. Description of the Related Arts

An impurity region (well) for forming a CMOS element has been formed, e.g., by implanting impurity ions and subjecting to thermal diffusion. However, even if an attempt is made to form a well in desired size, impurity ions would diffuse laterally so much that the region having a variety on the concentration of impurity ions near the boundary of the well would become longer. For this reason, it was necessary to provide in advance a wide ineffective region in which a threshold voltage or dielectric strength of a transistor could not be secured. The well has a profile that the concentration of impurity ions monotonously decreases from the surface downwards, and it has a structure susceptible to a latchup. Furthermore, it is necessary to include (i) a step of forming a channel stopper layer for preventing a leakage current in the bottom of a device isolation region in the well and (ii) a step of implanting ions for accurately controlling the distribution of impurity in a channel region and the lower part of the channel region for the control of the short channel effect of the transistor after forming the well.

In the meantime, with recent development of the technique of implanting high energy ions, it has now become possible to implant ions into the deep inside region of a substrate. Further, the ion implantation for formation of a well is performed at a relatively low concentration, which causes only slight damages to the substrate. Thus, it is possible to form the well by implanting impurity ions in a multistage manner with high energy without conventional high-temperature thermal treatment. Accordingly, in addition to the control of the threshold voltage of the transistor, latchup tolerance can be improved (i) by implanting ions directly below a thick isolation oxide film to form a channel stopper layer after formation of a device isolation region and also (ii) by raising the impurity concentration of the well within the substrate.

For example, Japanese Unexamined Patent Publication No. Hei 2(1990)-264464 (corresponding to U.S. Pat. No. 5,141,882) proposed a method of manufacturing CMOS through forming a well by the technique of implanting high energy ions in comparison with the conventional twin-well structure.

According to the above method, an oxide film and then a silicon nitride film are formed on a silicon substrate, followed by coating with a resist. Then, adopting photolithography and etching steps, an opening is made in the resist in a region which will become a device isolation region, and the silicon nitride film in the region is removed by etching.

Further processings are explained as follows, referring to FIGS. 9(a) to 9(e).

That is, a device isolation region 87 (0.5 μm thick) is formed by thermal oxidation, as shown in FIG. 9 (a).

Subsequently, a silicon nitride film 83 and an oxide film 82 are removed with hot phosphoric acid solution and hydrofluoric acid solution, respectively. Then, as shown in FIG. 9(b), a protective oxide film 82a is formed on a silicon substrate 81, and a resist pattern 88 having an opening in an NMOS transistor-forming region 96 is formed. Then, boron ions are implanted using the energy over the following three steps to form a P well 86 and to control a channel region 93.

First ion implantation: 200 keV to 700 keV (Boron ions are allowed to pass through the device isolation region 87, forming a channel stopper layer 89 directly below the device isolation region 87.)

Second ion implantation : 10 keV to 250 keV (The second implantation is performed with a lower energy than that of the first ion implantation.)

Third ion implantation: 10 keV to 80 keV (A channel region 93 for preventing the punch-through of a transistor and controlling the threshold voltage is formed.)

Then, a resist pattern 88 is removed, and a resist pattern 90 having an opening in a PMOS transistor-forming region 97 is formed, as shown in FIG. 9(c). Thereafter, ions of phosphorus, arsenic and boron are implanted with the following energy to form an N well 85 and to control the channel region.

First ion implantation: Phosphorus ions, 300 keV to 1200 keV (The ions are allowed to pass through the device isolation region 87, forming a channel stopper layer 91 directly below the device isolation region 87 to prevent a latchup.)

Second ion implantation: Phosphorus ions, 100 keV to 500 keV (This step is performed with a lower energy than that of the first ion implantation.)

Third ion implantation: Boron ions, 20 keV (A channel region 95 for controlling the threshold voltage of the transistor is formed.)

Fourth ion implantation: Arsenic ions, 50 keV to 220 keV (The channel 95 for preventing the punch-through of the transistor and controlling the threshold voltage is formed.)

Subsequently, the resist pattern 90 is removed, as shown in FIG. 9(d).

Further, the protective oxide film 82a is removed, and a CMOS transistor is formed through the conventional methods, as shown in FIG. 9 (e).

In the above-mentioned method, the twin-well is formed through two lithographic steps. This means that the manufacturing steps are simplified as compared with a conventional manufacturing steps.

Furthermore, as a more simplified method, a method of forming a twin-well through one lithographic step was proposed in Japanese Unexamined Patent Publication Nos. SHO 62(1987)-254203 and SHO 63(1988)-88714. Its method is explained in the following.

As shown in FIG. 10(a), a protective oxide film 101 and a resist pattern 112 having an opening in PMOS transistor-forming region are formed on a silicon substrate 100, and a P type region (P well) 102 is formed by implanting boron ions with high energy. Because the ions pass through the resist pattern 112 in this implanting step, a P well 102b is formed below the resist pattern 112 at a relatively shallow site of the silicon substrate 100, while the P well 102a is formed at a relatively deep site of the silicon substrate 100 in the region where the resist pattern 112 does not exist.

Then, as shown in FIG. 10(b), N type impurity ions such as phosphorus or the like are implanted with an energy which does not allow the ions to pass through the resist pattern 112, and thereby an N well 103 is formed in the PMOS transistor-forming region. In this way, a twin-well can be formed through one lithographic step.

After that, a device isolation insulating film 104 and a gate insulating film 105 are formed, as shown in FIG. 10(c).

Furthermore, as an improvement over the above-mentioned method conducted by one lithographic step, U.S. Pat. No. 5,501,993 proposed a method for performing ion implantation two or three times for forming each of N type and P type wells.

However, the methods of the above-mentioned prior arts are those of forming a twin-well structure which comprises forming an NMOS transistor having one kind of threshold voltage and a PMOS transistor having one kind of threshold voltage, and do not concern a method of forming MOS transistor having two or more kinds of threshold voltage.

In other words, concerning a semiconductor device having a CMOS circuit element for low voltage and low electric power consumption for which there is a strong demand in recent years, it has become necessary to manufacture two different kinds of transistors in order to satisfy the two requirements of high -speed operation and low electric power consumption. Thus, one is a transistor having a high threshold which works at a slow speed but whose stand-by leak current is controllable, and another is a transistor having a low threshold voltage which is suitable for working at a high speed but whose leak current is large. However, if an attempt is made to add the simplest step of controlling the concentration of impurity ions in the channel region for forming two regions of the same conductivity type having different threshold voltages, an additional lithography step is required, and accordingly an increase of the manufacturing cost is incurred.

In various methods of the known arts as mentioned above, a P well is formed by performing a step of implanting ions one to three times. According to such a method, however, it is not possible to sufficiently control the whole structure of a well (the whole P type region, including the channel region but excluding the substrate, is hereinafter referred to as a "well") which forms an NMOS transistor. The reason for this is that a P well should have characteristics satisfying all of the following requirements.

(1) A highly concentrated region is formed within a substrate, so that a well resistance may be reduced and a latchup tolerance may be increased.

(2) A relatively high concentrated region is formed in the ends and bottom portion of a device isolation region, so that a device isolation within a P well may be realized.

(3) The concentration in the deep portion of a channel is appropriately controlled, so that a punch-through of a transistor may be prevented.

(4) The concentration in a channel on the surface of a substrate is controlled, so that the threshold voltage of a transistor may be controlled.

It is difficult to control the threshold voltage of the transistor while preventing its short channel effect by implanting ions only once. Further, there is a problem that, if ions are implanted at a site of a channel stopper layer in such dosage as to improve the latchup tolerance, it would affect the channel too greatly in very fine elements having a thin device isolation region.

In the meantime, a method of manufacturing transistors having different threshold voltages without increasing the number of lithographic steps has been proposed in Japanese Unexamined Patent Publication No. HEI 02(1990)-67755.

In this method, firstly, ions of P type impurity such as boron or the like are implanted at a dosage of $8\times10^{12}/cm^2$ in NMOS transistor-forming regions 214 and 215 on a substrate 201, as shown in FIG. 11(a). Then, ions of N type impurity such as phosphorus or the like are implanted at a dosage of $6\times10^{12}/cm^2$ in the NMOS transistor-forming region 214 and a PMOS transistor-forming region 216.

Further, the substrate 201 is subjected to thermal treatment at 1050° to 1200° C. to form an N well 203, P well 202 and low concentrated P well 218.

Subsequently, a device isolation region 204 is formed and then ions of P type impurity such as boron or the like are implanted at a dosage of $7\times10^{11}/cm^2$ in channel regions 205, 206, 207 and 208, as shown in FIG. 11(b).

As shown in FIG. 11(c), a gate insulating film 209, a gate electrode 210 and source/drain regions 211 are formed, respectively, to complete three kinds of NMOS transistors of different threshold voltages and one kind of PMOS transistor.

In the method mentioned above, the P well 202 and N well 203 are those having ordinary concentration of impurity ions, and the low concentrated P well 218 is formed as a P well at a low concentration by canceling, with the N type impurity ions, a part of the P type impurity ions implanted as per FIG. 11(a). In the method mentioned above, the channel ion implantation for controlling the threshold voltage is performed on the whole surface of the substrate 201, and therefore three kinds of NMOS transistors can be formed by performing two lithographic steps for forming the P well and N well.

According to this method, the threshold voltages are controlled by implanting boron ions into the whole substrate 201. This implantation controls the threshold voltage of an NMOS transistor in a normal P well, the threshold voltage of a PMOS transistor in a normal N well, and also the threshold voltage of an NMOS transistor in a P well formed by simultaneously implanting the N type impurity ions and P type impurity ions. Therefore, it is extremely difficult to control each of the threshold voltages independently. This problem can be easily overcome by increasing the number of lithographic steps, but that would pose another problem of increasing the manufacturing steps.

Additionally, according to the method, both N type impurity ions and P type impurity ions are implanted to form one well, and the concentration of the well is decided by cancelling the two types of impurity ions with each other. This would restrict the formation of ordinary N and P wells, whereby the transistor formed in each of the three wells cannot be controlled independently. Moreover, the cancellation-type formation of wells leads to such a great variation in the concentration of impurity ions and such a poor reproducibility that it would be extremely difficult to control the threshold voltages in a highly accurate way. Especially in a case where a threshold voltage is desired to be lowered, the design for variation in the threshold voltage is so strict that it would be very difficult to adopt the method itself. Furthermore, no consideration is given to implantation of impurity ions for the channel stopper region under the device isolation insulating film in this method.

SUMMARY OF THE INVENTION

The present invention provides a method of manufacturing a semiconductor device comprising forming a device isolation region in a semiconductor substrate; forming at least a first conductivity type impurity region in the semiconductor substrate; and forming on the semiconductor substrate a transistor including a gate insulating film, a gate electrode, source/drain regions and a channel located directly under the gate electrode, wherein the first conductivity type impurity region is formed by the steps of: an ion implantation 1 having a concentration peak at a location deeper than the bottom of the device isolation region; an ion implantation 2 having a concentration peak at a location around the bottom of the device isolation region; an ion implantation 3 having a concentration peak around the junction regions where the source/drain regions are to be formed; and an ion implantation 4 having a concentration peak on or directly under the surface of the region where the channel is to be formed.

Also, the present invention provides a method of manufacturing a semiconductor device comprising forming a device isolation region deeper than 0.6 μm in a first conductivity type semiconductor substrate; forming at least a first conductivity type impurity region in the first conductivity type semiconductor substrate; and forming on the semiconductor substrate a transistor including a gate insulating film, a gate electrode, source/drain regions and a channel located directly under the gate electrode, wherein the first conductivity type impurity region is formed by the steps of: an ion implantation 1' having a concentration peak around the depth of 0.6 μm; an ion implantation 2' having a concentration peak around the depth of 0.35 μm; an ion implantation 3' having a concentration peak around the junction regions where the source/drain regions are to be formed; and an ion implantation 4' having a concentration peak on or directly under the surface of the region where the channel is to be formed.

Further, the present invention provides a method of manufacturing a semiconductor device comprising forming a device isolation region in a semiconductor substrate; forming plural first conductivity type impurity regions having different impurity concentration in the semiconductor substrate; and forming plural transistors each having different threshold voltage and including a gate insulating film, a gate electrode, source/drain regions and a channel located directly under the gate electrode, wherein the plural first conductivity type impurity regions having different impurity concentrations are formed by the steps of: forming a mask pattern on the semiconductor substrate, the mask pattern having an opening at least in a transistor-forming region where a transistor having threshold voltage of a first (larger) absolute value is to be formed; implanting first conductivity type impurity ions selectively into the transistor-forming region by using the mask pattern by the ion implantations 1 to 4 of the above (or by the ion implantations 1' to 4' of the above); and implanting first conductivity type impurity ions by ion implantation 5 that allows ions to penetrate through the mask pattern into the transistor-forming region which is covered with the mask pattern and in which a transistor having threshold voltage of a second absolute value which is smaller than the first absolute value is to be formed.

BRIEF DESCRIPTION OF THE DRAWINGS

FIGS. 81(a) to 81(c) are schematic views of the process showing a method of manufacturing s till another prior-art semiconductor device.

DETAILED DESCRIPTION OF THE PREFERRED EMBODIMENTS

Figure 1A:
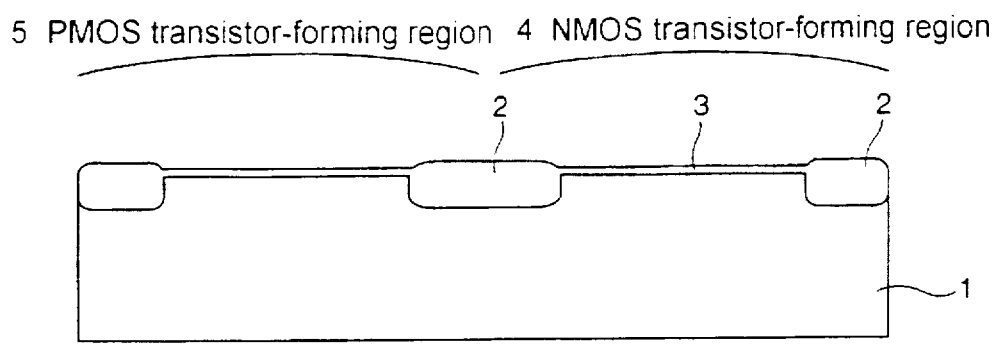
FIGS. 1(a) to 1(d) are schematic sectional views showing an example of a method of manufacturing a semiconductor device according to the present invention.

The present invention is directed to a method of forming the whole of an impurity region (well) located extending from the surface of a channel to the inside of the semiconductor substrate by performing the ion implantation in four steps to give an optimum impurity profile in manufacturing a semiconductor device including a transistor on a semiconductor substrate in which a device isolation region has been formed.

The semiconductor substrate to be used in the present invention is preferably a silicon substrate, but it is not particularly limited as long as it is a substrate ordinarily used for forming semiconductor devices such as PMOS, NMOS or CMOS, etc.

Firstly, a device isolation region is formed in the semiconductor substrate to define an active region. The device isolation region can be formed by a conventional method such as LOCOS method, improved LOCOS method, device isolation method by trench or the like. While the film thickness of the device isolation region can be appropriately adjusted depending upon various conditions such as size and depth of the impurity region (well) where a device is to be formed, concentration of the impurity ions, layout and size of the device or the like, preferable thickness is deeper than the source/drain region to be formed later.

The first conductivity type impurity region (well) is formed by 4-steps of ion implantation into the semiconductor substrate in which the device isolation region has been formed.

As the ion implantation 1, the first conductivity type impurity ions are implanted in such a way that the concentration distribution of impurity ions has a peak at a place deeper than the bottom of the device isolation region. It is preferable to conduct the implantation so that the peak is located at a place of about 0.4 to 1.0 μm deep. The location of the peak can be adjusted, for example, by regulating the implanting energy. More specifically, in the case where the first conductivity type impurity ions are P type, for example, it is preferable that boron ions are implanted with an implantation energy of about 130 to 500 keV. In the case where the first conductivity type impurity ions are N type, for example, it is preferable that phosphorus ions are implanted with an implantation energy of about 300 to 800 keV. Appropriate dosage for implanting impurity ions is about $5.0 \times 10^{12}$ to $5.0 \times 10^{13} \text{cm}^{-2}$.

Furthermore, in the case where the device isolation region has a film thickness of about 0.6 μm or over, the first conductivity type impurity ions are implanted in such a way that the concentration has a peak at depth of about 0.6 µm as the ion implantation 1'. In this case, if the semiconductor substrate and the first conductivity type impurity ions are P type, it is preferable that boron ions are implanted, for example, with an implantation energy of about 200 to 300 keV and a dosage of about $5.0 \times 10^{12}$ to $5.0 \times 10^{13} cm^{-2}$.

As the ion implantation 2, the first conductivity type impurity ions are implanted in such a way that the concentration distribution of impurity ions has a peak near the bottom of a device isolation region. More specifically, in the case where the device isolation region has a film thickness of about 0.2 µm to 0.5 µm, it is preferable to conduct the ion implantation by selecting the energy for implantation and the kind of ions appropriately so that a peak is located at depth of about 0.25 µm to 0.6 µm. In the case where the first conductivity type impurity ions are P type, boron ions are implanted, for example, with an implantation energy of about 80 to 200 keV. In this case, the dosage of impurity ions to be implanted is preferably about $1 \times 10^{12}$ to $1 \times 10^{13} cm^{-2}$. In the case where the first conductivity type impurity ions are N type, phosphorus ions are implanted, for example, with an implantation energy of about 150 to 500 keV and a dosage of about $1 \times 10^{12}$ to $1 \times 10^{13} cm^{-2}$.

Furthermore, when the device isolation region has a film thickness of more than about 0.6 µm, the first conductivity type impurity ions are implanted in such a way that the concentration has a peak at depth of about 0.35 µm or at depth of about two thirds to one half of the film thickness of the device isolation region, as the ion implantation 2'. When the semiconductor substrate and the first conductivity type impurity ions are P type, it is preferable that boron ions are implanted, for example, with an implantation energy of about 100 to 150 keV and a dosage of about $1 \times 10^{12}$ to $1 \times 10^{13} cm^{-2}$.

As the ion implantation 3, the first conductivity type impurity ions are implanted in such a way that the concentration distribution of impurity ions has a peak near the junction regions where the source/drain regions are to be formed. More specifically, in the case where the source/drain regions are formed at depth of about 0.1 to 0.3 µm, it is preferable to conduct the ion implantation by selecting appropriately the energy for implantation and the kind of ions to be implanted so that the peak is located at depth of about 0.15 to 0.4 µm. For example, in the case where the first conductivity type impurity region is P type, boron ions are implanted with implantation energy of about 40 to 150 keV. In this case, the dosage of impurity ions to be implanted is preferably about $1 \times 10^{12}$ to $1 \times 10^{13} cm^{-2}$. When the first conductivity type impurity region is N type, phosphorus ions are implanted, for example, with implantation energy of about 100 to 300 keV. In this case, the dosage of impurity ions to be implanted is preferably about $1 \times 10^{12}$ to $1 \times 10^{13} cm^{-2}$.

The ion implantation 3', which is carried out in the case where the film of the device isolation region is thick, can also be performed essentially in the same way as the above-mentioned ion implantation 3.

As the ion implantation 4, the first conductivity type impurity ions are implanted in such a way that the concentration distribution of impurity ions has a peak on the surface of or directly below a region to become a channel. More specifically, it is preferable to conduct the ion implantation by selecting appropriately the energy for implantation and the kind of ions so that the peak is located at depth of about 0 to 0.2 µm. In case of P type impurity ions, boron ions are implanted with implantation energy of about 10 to 60 keV; and the dosage of impurity ions to be implanted in this case is preferably about $1 \times 10^{12}$ to $5 \times 10^{12} cm^{-2}$. In case of N type impurity ions, phosphorus ions are implanted with implantation energy of about 10 to 150 keV; and the dosage of impurity ions to be implanted in this case is preferably about $1 \times 10^{12}$ to $5 \times 10^{12} cm^{-2}$.

The ion implantation 4', which is carried out in the case where the film of the device isolation region is thick, can be performed essentially in the same way as the above-mentioned ion implantation 4.

The above-mentioned ion implantations 1 to 4 and the ion implantations 1' to 4' can be sequentially performed by selecting conditions so that the peak of each implantation appears at a different place. However, these implantations need not to be performed sequentially from the first to the fourth. These implantations may be conducted continuously by changing the implantation conditions. In addition, as long as the above-mentioned four characteristics can be controlled independently each other, not only the four-step implantations but also implantations involving five or more steps can be conducted according to the sizes of the semiconductor device, the first conductivity type impurity region and the like.

The above-mentioned four-step implantations make it possible to control the depth of each peak in the first conductivity type impurity region by implanting ions independently and thus can control the characteristics of a transistor highly accurately In other words:

(1) By the ion implantation 1 or 1', the highly concentrated region is formed within the substrate, so that the well resistance can be reduced and the latchup tolerance can be increased.

(2) By the ion implantation 2 or 2', the relatively highly concentrated region is formed in the ends and the bottom portion of the device isolation region, so that the device isolation within the well can be realized.

(3) By the ion implantation 3 or 3', the concentration in the deep portion of the channel is appropriately controlled to prevent a punch-through of the transistor.

(4) By the ion implantation 4 or 4', the concentration at the channel region on the surface of the substrate is controlled to adjust the threshold voltage of the transistor.

In these four-step ion implantations, the first conductivity type impurity region, which is to be finally obtained, may be substantially uniformly controlled from the surface of the substrate to the bottom of the impurity region; or, alternatively, the first conductivity type impurity region may be allowed to have an impurity profile fully satisfying the above-mentioned characteristics. For example, the whole concentration in the first conductivity type impurity region can be uniformly or non-uniformly distributed within the range of about $5 \times 10^{16}$ to $5 \times 10^{18} cm^{-3}$.

After the first conductivity type impurity region is formed by the above-mentioned four-step ion implantation, the transistors each having a gate insulating film, a gate electrode and source/drain regions are formed on the impurity region, and then an interlayer insulating film, a wiring layer and the like are formed on these transistors to complete the semiconductor device.

More specifically, in order to form a gate insulating film, the surface of the silicon substrate may be oxidized by a thermal oxidation method in an atmosphere of oxygen and/or vapor at a temperature of about 800° to 950° C.

The gate electrode can be formed with a polysilicon single layer, a silicide with a high melting point metal and so on, or a single layer or a laminate layer of a polycide of these and so on, and a side wall spacer can be optionally formed.

The source/drain regions can be formed by implanting impurity ions at a desired dosage, in such a way that the region has a desired depth, and then optionally performing an annealing. It is preferable to perform the annealing in this case at about 850° to 950° C. for about 5 to 20 minutes. Thereafter, PSG, BPSG, $SiO_2$, SiN or the like is formed as an interlayer insulating film on the transistors thus formed, and the contact and metal wiring are provided to construct the semiconductor device.

The important feature in the method of manufacturing a semiconductor device according to the present invention, namely in forming the first conductivity type impurity region by implanting ions in four steps is that, immediately after these ion implantations, a thermal treatment is not conducted particularly for forming wells. In other words, the method according to the present invention omits thermal treatment for the formation of wells and utilizes, for this purpose, thermal treatment performed in other steps for forming integrated circuits including transistors.

For example, one or more thermal treatments conducted in the following steps can be utilized: gate insulating film forming step, source/drain region forming step, or interlayer insulating film forming step. The thermal treatment in each step is carried out for a relatively short time, for example 10 seconds to 30 minutes, usually at 1100° C. or below, preferably at 900° C. or below. By utilizing the thermal treatments in the above steps, it is possible to prevent excessive diffusion of impurity ions implanted for forming the first conductivity type impurity regions.

Furthermore, another feature of the method of manufacturing a semiconductor device according to the present invention is that two or more first conductivity type transistors having different threshold voltages can be formed on a semiconductor substrate.

In this invention, the device isolation region can also be formed in the same way as mentioned above. In accordance with the film thickness of the device isolation region, it is possible to adjust the depth of ion implantation for the formation of the first conductivity type impurity region which is formed in a later step.

Firstly, a mask pattern is formed on a semiconductor substrate on which the device isolation region has been formed. This mask pattern has an opening at least in a transistor-forming region where a transistor having threshold voltage of a first absolute value (e.g., high-Vth) is to be formed among plural first conductivity type transistors having different threshold voltage. At The mask pattern can be formed by applying a known resist to a thickness of about 1.0 to 4.0 µm and patterning the resist into a desired shape by photolithography and/or etching steps. This mask pattern can also have an opening in the outer circumference of a transistor-forming region where a transistor having threshold voltage of a second absolute value (e.g., threshold voltage of smaller than the first absolute value; low-Vth) is to be formed in addition to the opening in the high-Vth transistor-forming region.

First conductivity type impurity ions are selectively implanted into the high-Vth transistor-forming region by using the above-mentioned mask pattern. This implantation of the first conductivity type impurity ions can be performed by the ion implantations 1 to 4 or the ion implantations 1' to 4' in accordance with the film thickness of the device isolation region formed by the previous step. Concerning the ion implantations, it is preferable to adjust implanting conditions appropriately in order to secure the four characteristics (1) through (4) as described above. Thus, it is possible to form the first conductivity type impurity region in the high-Vth transistor-forming region in a relatively high concentration, for example, the first conductivity type impurity region having a uniform or non-uniform impurity profile within an impurity concentration range of $5\times10^{16}$ to $5\times10^{18} cm^{-3}$.

In the case where in previous steps the mask pattern has an opening in the outer circumference of a low-Vth transistor-forming region too, the first conductivity type impurity region in a relatively 'r-O high concentration is likewise formed in the outer circumference. Thus, this ensures the device isolation in a low-Vth transistor-forming region.

Further, the ion implantation 5 is performed using the same mask pattern. In this ion implantation 5, first conductivity type impurity ions are introduced into the surface of the semiconductor substrate through the mask pattern and it is necessary to perform the implantation with energy large enough to pass through the mask pattern. Moreover, the dosage of first conductivity type impurity ions to be implanted in this step can be properly decided depending upon the threshold voltage of a low-Vth transistor because the dosage corresponds to the impurity concentration in the channel portion of the transistor. Thus, the relatively shallow, first conductivity type impurity region having a relatively low concentration is formed on the whole or a part of the region covered with the mask pattern. In the region where the mask pattern does not exist, namely in a high-Vth transistor-forming region, the first conductivity type impurity ions are implanted in a considerably deep place in the semiconductor substrate, so that the characteristics of the high-Vth transistor are not directly affected. This ion implantation 5 does not need to be conducted after the ion implantations 1 to 4 or the ion implantations 1' to 4'. The ion implantation 5 may be alternatively conducted before or between these ion implantations or at any time as long as the same mask pattern can be used for the ion implantation.

While the aforementioned method is explained about transistors having at least two different threshold voltages, it is applicable to both N type and P type transistors. Furthermore, this method can also be applied to N type transistors having two different threshold voltages and a P type transistor, P type transistors having two different threshold voltages and an N type transistor, or P type transistors having two different threshold voltages and N type transistors having two different threshold voltages. In these methods, at least two lithographic steps and a simplified manufacturing method can be realized.

More specifically, the formation of a CMOS comprising NMOS transistors having at least two different thresh old voltages and PMOS transistors having at least two different threshold voltages is as follows:

At first, a mask pattern having an opening in each of a high-Vth NMOS transistor-forming region and a low-Vth PMOS transistor-forming region is formed. While a P type impurity region in a relatively high concentration is formed in these regions using the mask pattern by ion implantations in four steps, P type impurity ions are implanted in the surface of the low-Vth NMOS transistor region and the surface of the high-Vth PMOS transistor region covered with the mask pattern, by ion implantation through the mask pattern. Concerning the dosage of ions implanted to allow the impurity ions to pass through the mask pattern, it is preferable to set the concentration of impurity ions at a relatively low level, because the implantation is to form the low-Vth NMOS transistor-forming region.

Then, by conventional methods, a mask pattern having an opening in each of a high-Vth PMOS transistor-forming region and a low-Vth PMOS transistor-forming region is formed, and an N type impurity region is formed by ion implantations in four steps, using this mask pattern. By the aforementioned four-step ion implantation, P type impurity ions of a relatively high concentration have been implanted in the low-Vth PMOS transistor-forming region; and P type impurity ions for adjusting the threshold voltage of the low-Vth NMOS have been implanted at a deep place in the semiconductor substrate. It is preferable to adjust appropriately the dosage of impurity ions to be implanted, so that the P type impurity ions at least on the surface of the semiconductor substrate are cancelled by this four-step ion implantation to form an N type impurity region in a relatively low concentration. Likewise, a P type impurity region in a relatively low concentration has been formed in the high-Vth PMOS transistor-forming region by ions implanted through the afore-mentioned mask pattern. It is preferable to adjust appropriately the dosage of impurity ions to be implanted, so that the low concentrated P type impurity ions are cancelled by this four-step implantation to form an N type impurity region in a relatively high concentration.

Hereinafter, practical examples on the method of to manufacturing a semiconductor device according to the present invention is described based on the drawings.

Example 1

First, as shown in FIG. 1(a), a device isolation region 2 with a film thickness of about 3000 Å was selectively formed in an inactive region on a P type silicon substrate 1 by an improved LOCOS method. A protective oxide film 3 of 200 Å was also formed by a thermal oxidation in an active region which is not coated with the device isolation region 2. In this example, the formation of an NMOS transistor as well as the formation of a PMOS transistor-forming region 5 adjacent to an NMOS transistor-forming region 4 are explained.

Figure 1B:
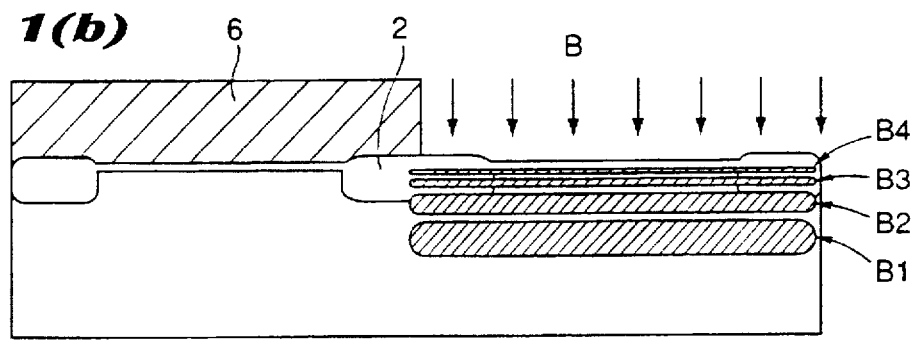

Then, in order to form a P well 14, as shown in FIG. 1(b), a resist pattern 6 with a film thickness of 2.0 µm having an opening in the NMOS transistor-forming region 4 (including a part of the device isolation region 2) was formed, and boron ions were implanted using this resist pattern 6 as a mask under the following conditions.

B1 Implantation energy: 250 keV, Dosage: $1 \times 10^{13}$ cm$^{-2}$
B2 Implantation energy: 120 keV, Dosage: $3 \times 10^{12}$ cm$^{-2}$
B3 Implantation energy: 60 keV, Dosage: $2 \times 10^{13}$ cm$^{-2}$
B4 Implantation energy: 20 keV, Dosage: $3 \times 10^{12}$ cm$^{-2}$ All ions implanted under the above-mentioned conditions remained in the resist and were not implanted into the PMOS transistor-forming region 5 coated with the resist pattern 6.

Figure 1C:
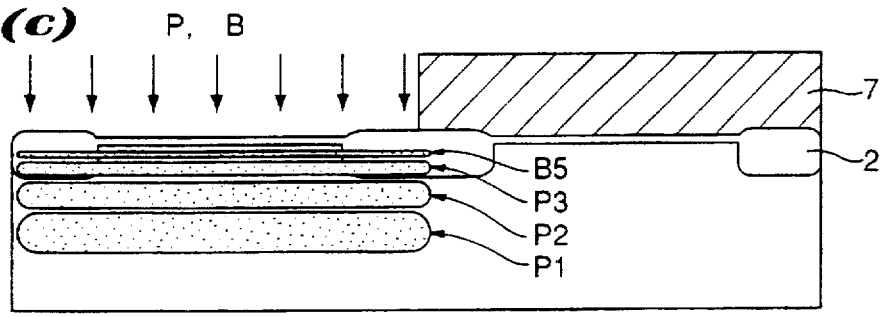

Thereafter, the resist pattern 6 was removed, and, as shown in FIG. 1(c), in order to form an N well 15 and a superficial P region 16, a resist pattern 7 with a film thickness of 2.0 µm having an opening in the PMOS transistor-forming region 5 (including also a part of the device isolation region 2) was formed, and phosphorus ions and boron ions were implanted using this resist pattern 7 as a mask under the following conditions.

P1 Phosphorus ions, implantation energy: 600 keV, Dosage: $3 \times 10^{13}$ cm$^{-2}$
P2 Phosphorus ions, implantation energy: 230 keV, Dosage: $2 \times 10^{12}$ cm$^{-2}$
P3 Phosphorus ions, implantation energy: 100 keV, -continued Dosage: $1 \times 10^{12}$ cm$^{-2}$
B5 Boron ions, implantation energy: 20 keV, Dosage: $3.3 \times 10^{12}$ cm$^{-2}$ All ions implanted under the above-mentioned conditions remained in the resist and were not implanted into the NMOS transistor-forming region 4 coated with the resist pattern 7.

Figure 1D:
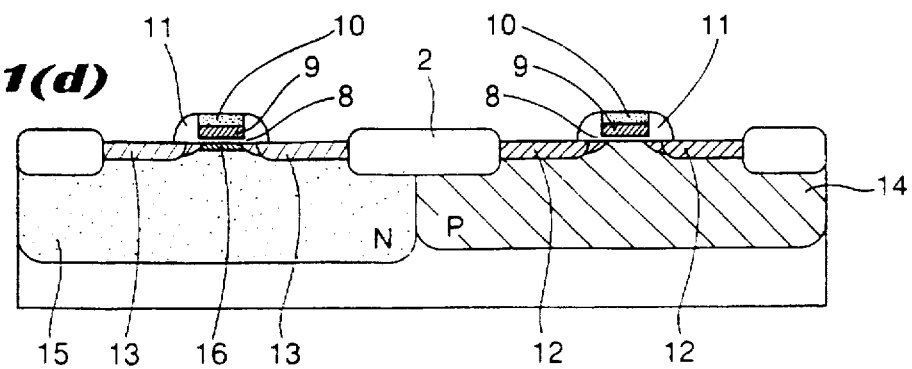

Then, using a conventional technique, as shown in FIG. 1(d), there was formed a CMOS transistor having an NMOS transistor comprising a gate insulating film 8 with a thickness of about 80 Å; a gate electrode including an N$^+$ polysilicon film 9 with a thickness of 1000 Å and a WSi film 10 with a thickness of 1000 Å and having a side wall spacer 11; and source/drain regions 12 having an LDD structure, and the PMOS transistor comprising a gate insulating film 8; a gate electrode including an N$^+$ polysilicon film 9 and a WSi film 10 and having a side wall spacer 11; source/drain regions 13 having an LDD structure; and a superficial P region 16. In this example, because the N$^+$ polysilicon gate electrode was used in both NMOS and PMOS transistors, the PMOS transistor became a buried channel type and, therefore, the threshold voltage was adjusted by providing the superficial P region 16 on the surface of the N well 15.

In this example, the gate electrode was formed to have the minimum gate length of 0.35 µm for the NMOS transistor and the minimum gate length of 0.45 µm for the PMOS transistor. In addition, though it was not shown in the drawings, a wire (a ground wire) for electric power supply to the wells was connected to the NMOS transistor-forming region 4, and the P$^+$ diffusion region was formed therefor. In the case of the PMOS transistor-forming region 5, the N$^+$ diffusion region was likewise formed.

In this example, no intentional annealing to activate the wells was carried out. In the gate oxidizing step or in the step of annealing the interlayer insulating film (BPSG film, not shown in the drawing) formed on the transistor after completion of the transistor, the impurity ions forming the wells were automatically activated. These thermal treatments were all carried out at 900° C. No remarkable diffusion of impurity ions occurred at such a temperature. Therefore, the well concentration transition region occurring between the N well and the P well was about 1.0 µm at the largest, and the ineffective region between the N well and P well was reduced to about 1.5 µm, in view of the superposition precision in the photolithographic step and various margins.

In respect to the NMOS transistor in this example, the peak of impurity concentration (peak position) at each place shown below could be controlled by performing ion implantation in four steps from B1 to B4. Though impurity ions influenced each other in the implanting region between the N well and the P well, the controlling capability was improved.

| | |
|---|---|
| B1 Peak position: 0.6 µm | A place deeper than the bottom of the device isolation region |
| B2 Peak position: 0.35 µm | Near the bottom of the device isolation region (0.35 µm thick) |
| B3 Peak position: 0.18 µm | Near the junction of source/drain regions (0.15 µm deep) |
| B4 Peak position: 0.05 µm | Superficial channel layer |

It was also noted that, by changing the implanted dosage of B4 above, the threshold voltage of the NMOS transistor was freely controlled at not less than 0.4 V, in which case the short channel effect of the transistor did not worsen. In other words, as compared with a long-channel transistor, the reduction of threshold voltages with a gate length of 0.35 μm was controlled below 0.1 V in each implantation. Therefore, it became possible to establish easily an optimum threshold voltage for each of various devices.

Example 2

Figure 2A:
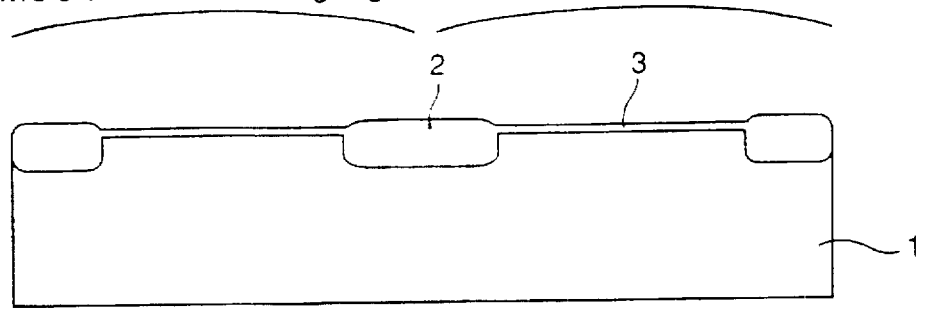
FIGS. 2(a) to 2(d) are schematic sectional views showing another example of a method of manufacturing a semiconductor device according to the present invention.

As shown in FIG. 2(a), a device isolation region 2 and a protective oxide film 3 were formed on a silicon substrate 1 in the same way as in Example 1, except that the thickness of the device isolation region was about 2500 Å. In this example, detailed explanation is given on the formation of a PMOS transistor and also on the case where an NMOS transistor-forming region 4 is formed adjacent to a PMOS transistor-forming region 5.

Figure 2B:
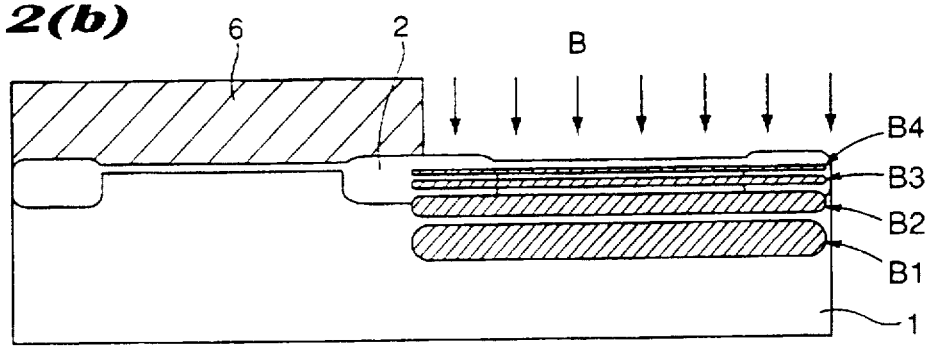

Then, as shown in FIG. 2(b), in order to form a P well 14, a resist pattern 6 having an opening in an NMOS transistor-forming region 4 was formed, and boron ions were implanted in four steps in the same way as in Example 1.

Figure 2C:
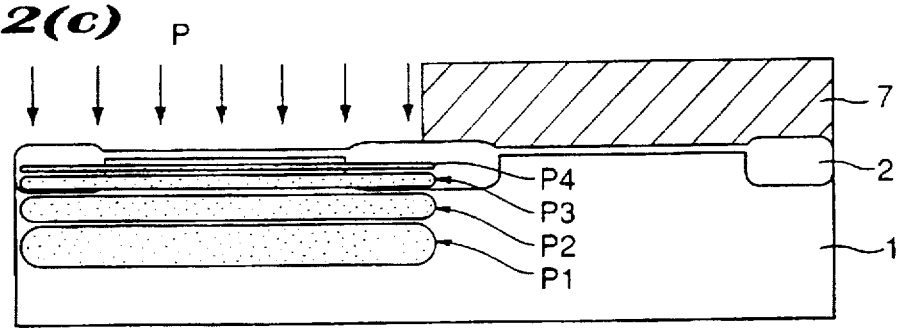

There after, the resist pattern 6 was removed, and, as shown in FIG. 2(c), in order to form an N well 15, a resist pattern 7 having an opening in the PMOS transistor-forming region 5 (including a part of the device isolation region 2) was formed, and phosphorus ions were implanted using this resist pattern 7 as a mask under the following conditions.

Figure 2D:
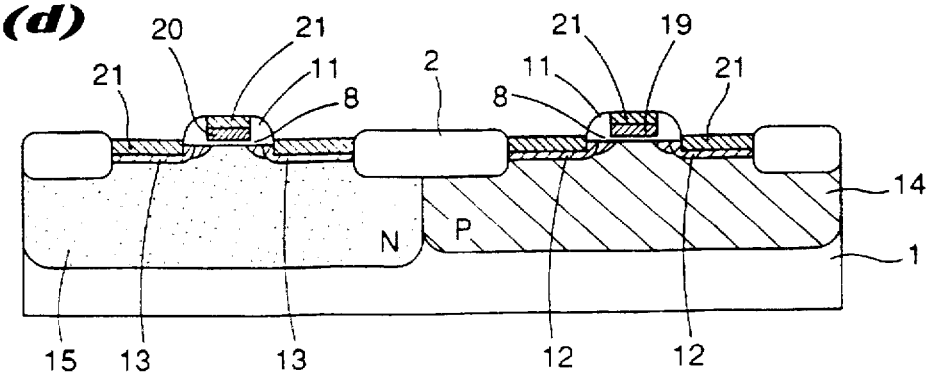

P1 Implanting energy: 600 keV, Dosage: $3 \times 10^{13}$ cm$^{-2}$
P2 Implanting energy: 230 keV, Dosage: $2 \times 10^{12}$ cm$^{-2}$
P3 Implanting energy: 100 keV, Dosage: $1 \times 10^{12}$ cm$^{-2}$
P4 Implanting energy: 60 keV, Dosage: $3.3 \times 10^{12}$ cm$^{-2}$ Then, as shown in FIG. 2(d), a CMOS transistor having an NMOS transistor and a PMOS transistor, each comprising the following components was formed, using a conventional technique: a gate insulating film 8 with a thickness of about 60 Å: a gate electrode including an N$^+$ polysilicon film 19 or a P$^+$ polysilicon film 20 with a thickness of about 2000 Å having on the surface a silicide layer (TiSi$_2$ layer) 21 with a thickness of about 1000 Å source/drain regions 12 or 13 having an LDD structure and having a silicide layer 21 formed in a self-aligned manner on the surface in the self-alignment on the surface the silicide layer 21. Because the dual-gate structure was adopted in FIG. 2(d) in which an N$^+$ polysilicon gate electrode was used for the NMOS transistor and a P$^+$ polysilicon gate electrode was used for the PMOS transistor, both transistors were of the superficial channel type.

In this example, the gate electrode was formed to have the minimum gate length of 0.25 μm for the NMOS transistor and the minimum gate length of 0.25 μm for the PMOS transistor. In addition, though it was not shown in the drawings, a wire (a ground wire) for electric power supply to the wells was connected in the NMOS transistor-forming region 4, and the P$^+$ diffusion region was formed therefor. In the case of the PMOS transistor-forming region 5, the N$^+$ diffusion region was likewise formed.

In this example, no intentional annealing to activate the 5wells was carried out. In the gate oxidizing step and in the step of annealing for forming the source/drain regions, the wells were automatically activated. Of the temperatures for the thermal treatment, the highest temperature was 1100° C. (treatment time: 10 seconds). No remarkable diffusion of impurity ions occurred at such a thermal budget. Therefore, the well concentration transition region occurring between the N well and the P well was about 1.0 μm at the largest, and the ineffective region between the N well and the P well could be reduced to about 1.5 μm in view of the superposition precision in the photolithographic step and various margins.

With respect to the NMOS transistor in this example, the peak of impurity concentration at each place could be controlled in the same way as in Example 1 by performing ion implantation in four steps from B1 through B4. Though impurity ions influenced each other in the implanting region between the N well and the P well, the controlling capability was improved.

As to the NMOS transistor, the implanting dosage of B4 above was changed, and the threshold voltage of the NMOS transistor could be freely controlled at not less than 0.3 V, as in Example 1. Even in such a case, the short channel effect of the transistor did not worsen in particular. In other words, as compared with a long-channel transistor, lowering of the threshold voltage at a gate length of 0.25 μm was each controlled below 0.1 V. Thereby, it became possible to set an optimum threshold voltage easily for each of various devices.

In respect of the PMOS transistor, in the meantime, peaks of the impurity concentration at each place shown below could be controlled by performing ion implantation in four steps from P1 through P4. Though impurity ions influenced each other in the implanting region between the N well and the P well, the controlling capability was improved.

| | |
|---|---|
| P1 Peak position: 0.7 μm | At a place deeper than the bottom of the device isolation region |
| P2 Peak position: 0.28 μm | Near the bottom of the device isolation region (0.25 μm thick) |
| P3 Peak position: 0.1 μm | Near the junction (0.15 μm deep) of the source/drain diffusion layers |
| P4 Peak position: 0.05 μm | Superficial channel layer |

In respect of the PMOS transistor, the same effect as in the NMOS transistor in Example 1 was obtained. By changing the implanting dosage of P4 above, the threshold voltage of the PMOS transistor was freely controlled at not less than 0.3 V. Even in such a case, the short channel effect did not worsen in particular. In other words, as compared with a long-channel transistor, the lowering of the threshold voltage at a gate length of 0.25 μm was each controlled below 0.1 V. Thereby, an optimum threshold voltage for each of various devices was easily set.

Example 3

Figure 3A:
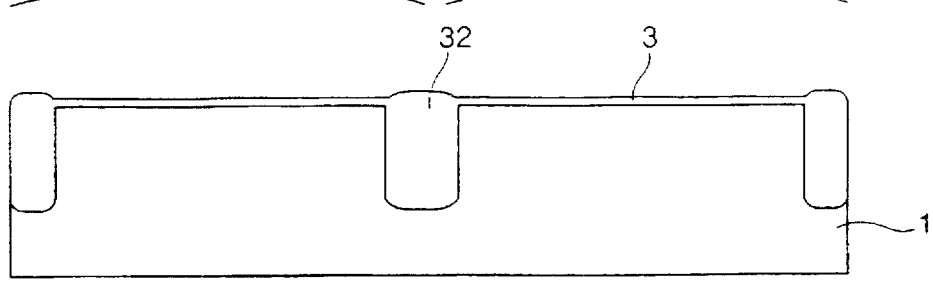
FIGS. 3(a) to 3(d) are schematic sectional views showing still another example of a method of manufacturing a semiconductor device according to the present invention.

This example was performed in the same manner as in Example 2 except that a device isolation region was constructed by relatively deep trench isolation. In other words, as shown in FIG. 3(a), a trench device isolation region 32 with a depth of 0.7 μm was formed on a P type silicon substrate 1.

Figure 3B:
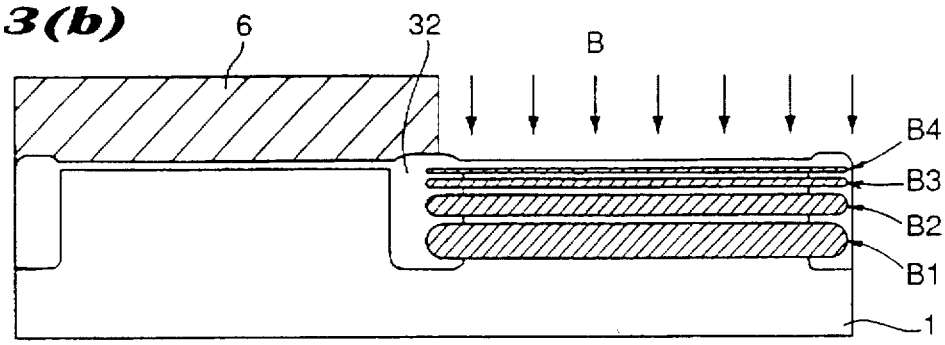
Figure 3C:
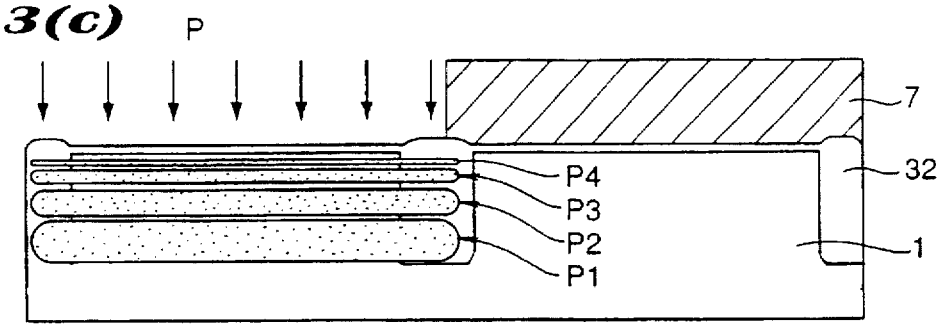
Figure 3D:
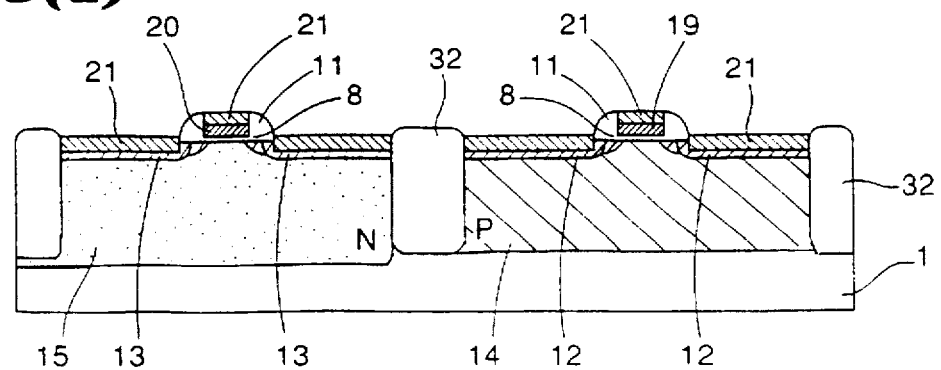

As shown in FIG. 3(b) and FIG. 3(c), further the ion implanting energy and the dosage for forming wells in an NMOS transistor-forming region 4 and a PMOS transistor-forming region 5 were the same as in Example 2. As shown in FIG. 3(d), the subsequent formation of the transistors was the same as in Example 2.

In this example, since a device isolation region 32 was trench-shaped and relatively deep, it was necessary to implant ions targeting at the deeply trenched bottom and also below the bottom if the ion implantation was to be realized in the same way as in Examples 1 and 2. For example, if the trench is 1.0 μm, 500 keV to 1.0 MeV of energy is required for implanting boron ions and 800 keV to 1.5 MeV of energy is required for implanting phosphorus ions. In order to stop ions to be implanted with such high energy, the resist thicker than those actually used in Examples 1 and 2 becomes necessary. However, if a thicker resist is used, the resolving power decreases, and it becomes difficult to dispose, with good precision, the ends of a resist pattern on the isolation region which has been formed in a fine structure by trench isolation. Besides, an equipment for implanting high energy ions will be required, which would unfavorably incur an increase in the cost of equipment.

Even if the trench isolation was deep as in this example, the same conditions as in Example 2 can be adopted in implanting ions for forming wells, because the characteristics of a transistor are determined near the surface. Since in this case P type impurity ions have not been implanted into the trench isolation bottom in the NMOS transistor-forming region 4, the concentration of the P type impurity ions may become low and may lead to leakage pass. However, since the concentration of P type impurity ions in the electric current passageway along the sides of the trench isolation is kept at a high level by the above ion implantation, leakage current can be maintained at a low concentration level as in Example 2.

Example 4

In this example, a method of manufacturing MOS transistors having different threshold voltages is described. Namely, a method of manufacturing the CMOS transistor comprising a high-Vth NMOS transistor of a relatively high threshold voltage (Vth being 0.4 to 0.7 V), a low-Vth NMOS transistor of a relatively low threshold voltage (Vth being 0 to 0.3 V), additionally a high-Vth PMOS transistor of a relatively high (in the absolute value) threshold voltage (Vth being −0.4 to −0.7 V) and a low-Vth PMOS transistor of a relatively low (in the absolute value) threshold voltage (Vth being 0 to −0.3 V) is shown herein.

Figure 4:
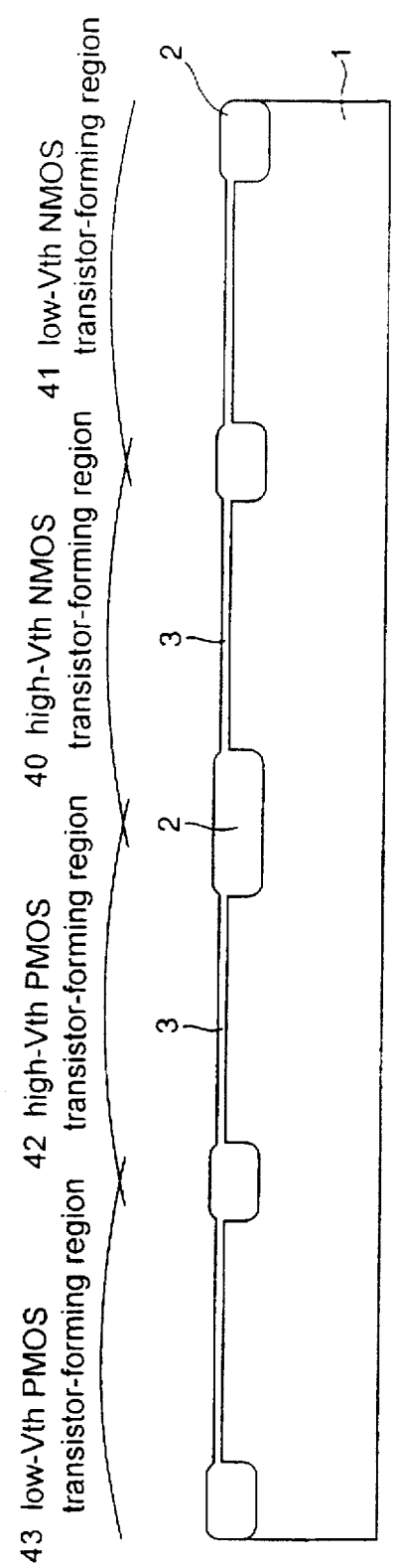
FIG. 4 is a view of the first process showing still another example of a method of manufacturing a semiconductor device according to the present invention.

Firstly, as shown in FIG. 4, a device isolation region 2 with a film thickness of about 3000 Å and a protective oxide film 3 with a thickness of 200 Å were formed on a P type silicon substrate 1 in the same way as in Example 1.

Figure 5:
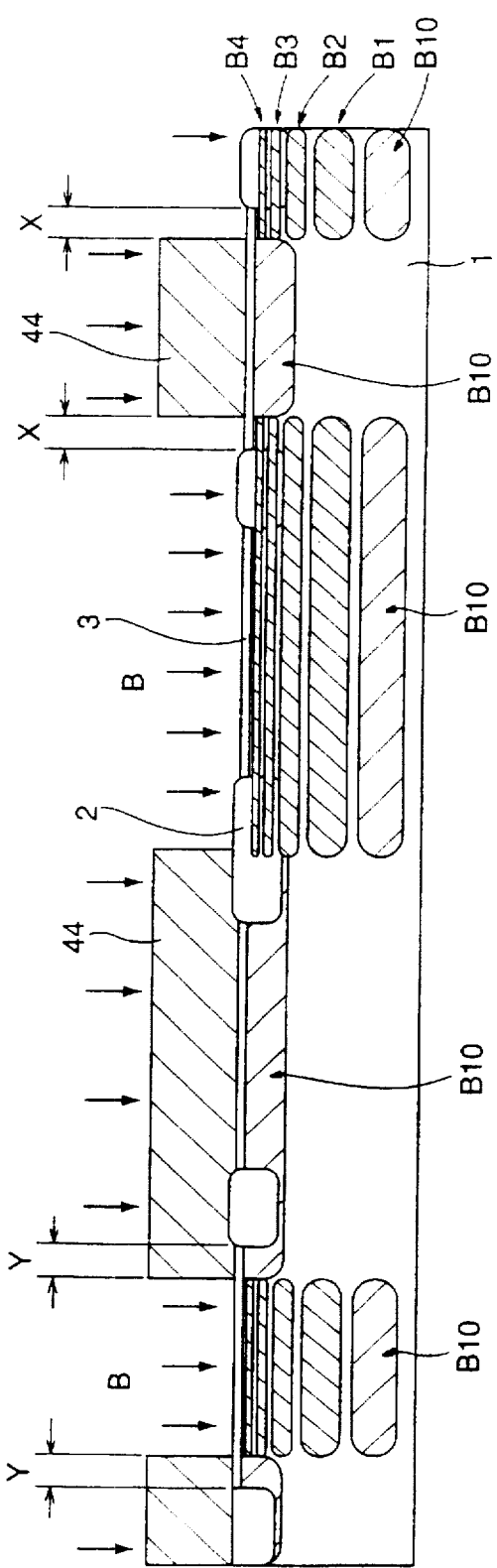
FIG. 5 is a view of the second process showing still another example of a method of manufacturing a semiconductor device according to the present invention.

Then, as shown in FIG. 5, a resist pattern 44 with film thickness of 2.0 μm, having an opening in each of a high-Vth NMOS transistor-forming region 40 and a low-Vth PMOS transistor-forming region 43 was formed, and boron ions were implanted using this resist pattern 44 as a mask under the following conditions.

| | |
|---|---|
| B1 Implanting energy: 250 keV, | Dosage: $1.6 \times 10^{13}$ cm$^{-2}$ |
| B2 Implanting energy: 120 keV, | Dosage: $4.7 \times 10^{12}$ cm$^{-2}$ |
| B3 Implanting energy: 60 keV, | Dosage: $3.1 \times 10^{12}$ cm$^{-2}$ |
| B4 Implanting energy: 20 keV, | Dosage: $3 \times 10^{12}$ cm$^{-2}$ |
| B10 Implanting energy: 1000 keV, | Dosage: $1.2 \times 10^{12}$ cm$^{-2}$ |

Of these implanted ions, all ions implanted by the steps from B1 through B4 remained in the resist and were not implanted into a high-Vth PMOS transistor-forming region 42 and a low-Vth NMOS transistor-forming region 41 coated with a resist. The ions implanted by B10 penetrated through the resist pattern 44 and reached the surface of a silicon substrate 1. By this implanting step, it was possible to directly adjust the concentration of impurity ions on the surface of the silicon substrate 1 in the low-Vth NMOS transistor-forming region 41 (thus, the low concentrated P type region 46 in FIG. 7 was formed.). In the region where the resist pattern 44 did not exist, ions implanted through this implantation step reached the deep portion of the substrate (deeper than 1 μm), and the dosage of implanted boron ions was much lower than that in B1 (by about an order of magnitude). Thus, there is little electrical influence to be taken into consideration.

Further, the low-Vth NMOS transistor-forming region 41 was not completely coated in the resist pattern 44, while an exposed region X was provided in the outer circumference of the transistor-forming region 41, and a coated region Y was provided in the outer circumference of the low-Vth PMOS transistor-forming region 43. Thereby, definite device isolation in the low-Vth MOS transistor-forming region is assured.

Figure 6:
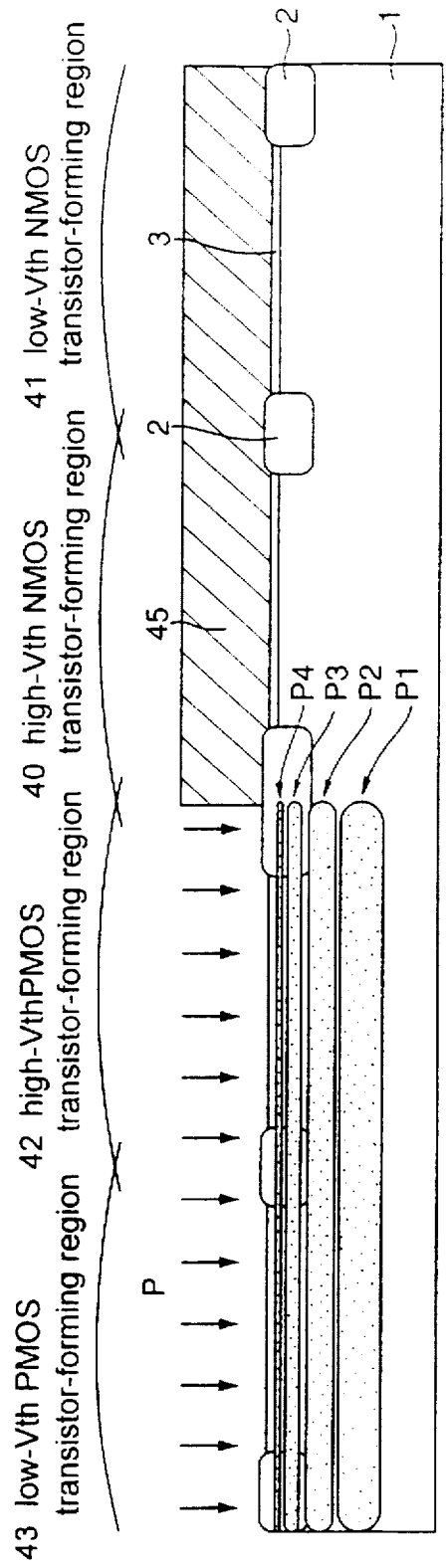
FIG. 6 is a view of the third process showing still another example of a method of manufacturing a semiconductor device according to the present invention.

Thereafter, the resist pattern 44 was removed, and, as shown in FIG. 6, a resist pattern 45 with a film thickness of 2.0 μm having an opening in each of the high-Vth PMOS transistor-forming region 42 and the low-Vth PMOS transistor-forming region 43 was formed, and phosphorus ions were implanted using this resist pattern 45 as a mask under the following conditions.

| | |
|---|---|
| P1 Implanting energy: 600 keV, | Dosage: $3.1 \times 10^{13}$ cm$^{-2}$ |
| P2 Implanting energy: 300 keV, | Dosage: $1.2 \times 10^{12}$ cm$^{-2}$ |
| P3 Implanting energy: 120 keV, | Dosage: $5.3 \times 10^{12}$ cm$^{-2}$ |
| P4 Implanting energy: 40 keV, | Dosage: $1.7 \times 10^{12}$ cm$^{-2}$ |

All ions implanted by the steps from P1 through P4 remained in the resist and were not implanted into the NMOS transistor-forming regions 40 and 41 coated with the resist.

In the high-Vth PMOS transistor-forming region 42, the implantation dosage for the steps P3 and P4 was increased as compared with Example 2. This is because boron, i.e., P type impurity, had been implanted into the surface of the substrate 1 in the previous ion implantation step B10, and therefore, it was intended to increase the concentration of N type impurity ions for compensating for the boron ions. Furthermore, since the boron concentration in the surface brought about by the step B10 was about several times to ten times lower than the phosphorous concentrations brought about by the steps P3 and P4, there is little variation in the threshold voltage of the high-Vth PMOS transistor due to the step B10.

In the low-Vth PMOS transistor-forming region 43, both of boron ions and phosphorus ions were implanted into the positions in the similar depths. In a relatively deep portion of the substrate 1 (the region in which phosphorus ions were implanted by P1 and P2) concentration of phosphorus ions is higher, and accordingly the N type regions are formed as a whole. In a relatively shallow portion of the substrate 1 (the region in which phosphorus ions were implanted by P3 and P4), a low concentration N type region (47 in FIG. 7) having phosphorus concentration approximately equivalent to the boron concentration in the low-Vth NMOS transistor is formed.

Because a dual type structure was adopted in this example, the NMOS transistor and the PMOS transistor having an almost equal threshold voltage in the absolute value, respectively showed substantially almost equal concentrations of P type impurity ions and N type impurity ions on their surface. In order to attain such a state in th e high-Vth NMOS transistor-forming region 40 and the high-Vth PMOS transistor-forming region 42, the dosage of N type ions implanted into the high-Vth PMOS transistor-forming region 42 was larger than the dosage of boron ions implanted into the high-Vth NMOS transistor-forming region 40, by the dosage equivalent to that of boron ions implanted into the surface by the step B10.

Figure 7:
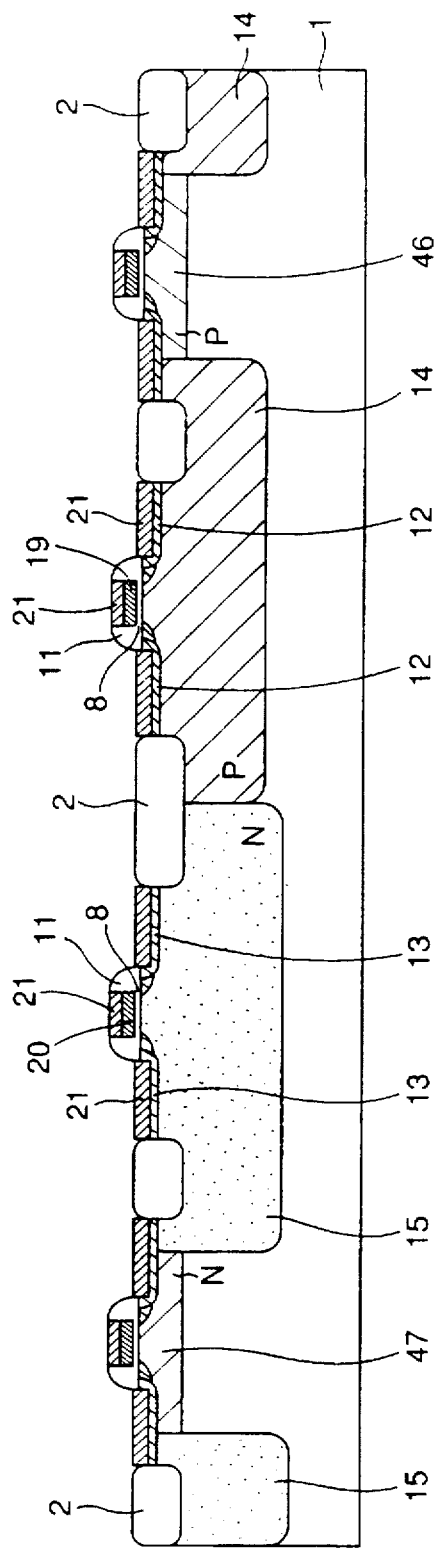
FIG. 7 is a view of the fourth process showing still another example of a method of manufacturing a semiconductor device according to the present invention.

Then, as shown in FIG. 7, a CMOS transistor having an NMOS transistor and a PMOS transistor, each comprising the following components, was formed by using a conventional technique: a gate insulating film 8 with a film thickness of about 60 Å; a gate electrode having a silicide layer (TiSi$_2$ layer) 21 with a film thickness of about 1000 Å on the surface and including an N$^+$ polysilicon film 19 and P$^+$ polysilicon film 20 with a film thickness of about 2000 Å; source/drain regions 12 or 13 having an LDD structure and having a silicide layer 21 formed in a self-aligned manner on the surface.

In this example, the gate electrodes were formed to have the minimum gate length of 0.25 µm for the high-Vth NMOS transistor, the minimum gate length of 0.45 µm for the low-V th NMOS transistor, the minimum gate length of 0.25 µm for the high-Vth PMOS transistor and the minimum gate length of 0.45 µm for the low-Vth PMOS transistor. In addition, though it is not shown in the drawings, a wire (a ground wire) for electric power supply to the wells was connected to the NMOS transistor-forming region 4, and therefore the P$^+$ diffusion region was also formed. In case of the PMOS transistor-forming region, the N$^+$ diffusion region was likewise formed.

In the CMOS thus manufactured in this example, the threshold voltages of the transistors were 0.65 V for the high-Vth NMOS transistor, 0.2 V for the low-Vth NMOS transistor, −0.7 V for the high-Vth PMOS transistor and −0.2 V for the low-Vth PMOS transistor respectively.

In this example, the resist pattern 44 used in FIG. 5 was formed so as to provide an exposed region X in the outer circumference of the low-Vth NMOS transistor-forming region 41 and the coating region Y in the outer circumference of the low-Vth PMOS transistor-forming region 43; and as a result, the region in a relatively high impurity concentration was formed in the outer circumference of each of the low-Vth NMOS transistor-forming region 41 and the low-Vth PMOS transistor-forming region 43. In other words, a P well 14 and an N well 15, which were formed in the high-Vth NMOS transistor-forming region 40 and the high-Vth PMOS transistor-forming region 42 adjacent to the low-Vth NMOS transistor-forming region 41 and the low-Vth PMOS transistor-forming region 43, reached the outer circumference of the low-Vth NMOS transistor-forming region 41 and the low-Vth PMOS transistor-forming region 43. This is to assure a definite device isolation by positioning a relatively high concentration region near the outer circumference of the above-mentioned transistor-forming regions because, especially in case of NMOS transistors, OFF state leakage current occurs in a lowly concentrated well due to a positive fixed charge in the bottom and the ends of a device isolation region and the off characteristics of the transistor are deteriorated. In case of PMOS transistors, it is not always necessary to position such a relatively high concentration region but it is useful to allow their device isolation property to be common to that of the high-Vth MOS transistors. In other words, in case where the device isolation property is different between a high-Vth MOS transistor and a low-Vth MOS transistor, different layout rules have to be established for the respective MOS transistors and, therefore, the design becomes much complicated. On the other hand, according to this example, the device isolation property can be common in all the transistors and the designing of CMOS's becomes easier.

As explained above, it is possible in this example to realize the step of forming a well for a CMOS circuit element comprising two kinds of NMOS transistors having different threshold voltages by conducting the photolithographic step twice. Further, it is possible in case of NMOS transistors to control the impurity concentration in the whole of the well structure by using a mask pattern having an opening in the well for a high-Vth transistor in which the NMOS transistor having the larger threshold voltage in the absolute value is positioned. It is possible to control the threshold voltage of the NMOS transistor (whose region is always coated with a mask pattern through the photolithographic step conducted twice) having the smaller threshold voltage in the absolute value by such an ion implantation (low-Vth implantation) that allows ions to penetrate through the above-mentioned mask pattern. This ion implantation gives little influence on the characteristics of transistors having the larger threshold voltage in the absolute value. The reason is that the low-Vth implantation implants ions into the deepest place in the high-Vth well and also that impurity ions for low-Vth are implanted at lower concentration and less dosage than impurity ions for high-Vth. While the low-Vth implantation is made into the PMOS region as well in this example, the dosage implanted is little and so it can be easily corrected by adjusting the dosage implanted into the N well. According to the present invention, therefore, two kinds of threshold voltages can be controlled easily with high precision, without leaving significant effects.

In this example, both of the NMOS transistor and the PMOS transistor are intended to have two kinds of threshold voltages, and the low threshold voltage PMOS transistor-forming region 43 is open for each of the two kinds of masks, whereby impurity ions of the N well and the P well are simultaneously introduced to cancel the impurity ions with each other. The stability of the threshold voltage is not so good as compared with the low-Vth NMOS transistor, but slight variations in Vth are within an acceptable range for practical use, because the limitation on off-current are not so stringent in the low-Vth PMOS transistors unlike single Vth transistors.

Example 5

In this example, explanations are also given on a method of manufacturing MOS transistors having different threshold voltages.

Figure 8A:
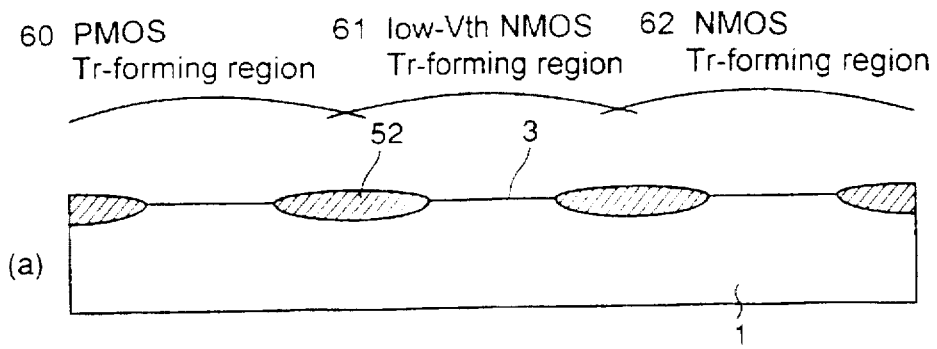
FIGS. 8(a) to 8(d) are schematic sectional views showing still another example of a method of manufacturing a semiconductor device according to the present invention.

Firstly, as shown in FIG. 8(a), a device isolation region 52 with a film thickness of about 3000 Å was selectively formed in an inactive region on a P type silicon substrate 1 by LOCOS method in the same way as in Example 1. A protective oxide film 3 of 140 Å was also formed by thermal oxidation on an active region which is not coated with the device isolation region 52.

Figure 8B:
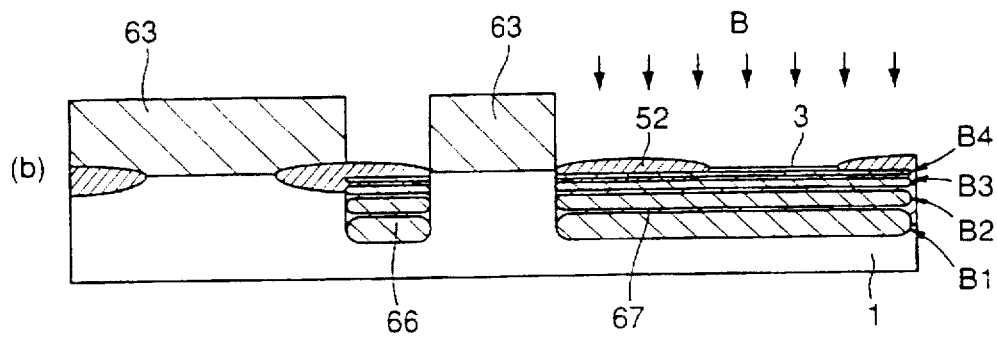

Then, as shown in FIG. 8(b), there was formed a resist pattern 63 having an opening on an NMOS transistor-forming region 62 (including the device isolation region 52) and a part of the device isolation region 52 located in the outer circumference of a low-Vth NMOS transistor-forming region 61; and boron ions were implanted using this resist pattern 63 as a mask under the following conditions.

| | |
|---|---|
| B1 Implanting energy: 250 keV, | Dosage: 1 × 10$^{13}$ cm$^{-2}$ |
| B2 Implanting energy: 120 keV | Dosage: 3 × 10$^{12}$ cm$^{-2}$ |
| B3 Implanting energy: 60 keV | Dosage: 2 × 10$^{12}$ cm$^{-2}$ |
| B4 Implanting energy: 20 keV | Dosage: 3 × 10$^{12}$ cm$^{-2}$ |

Thereby, an ion-implanted region 66 can be formed directly under the device isolation region 52 while a P well 67 is formed. Thus, the characteristics such as device isolation dielectric strength and the like can be improved.

Figure 8C:
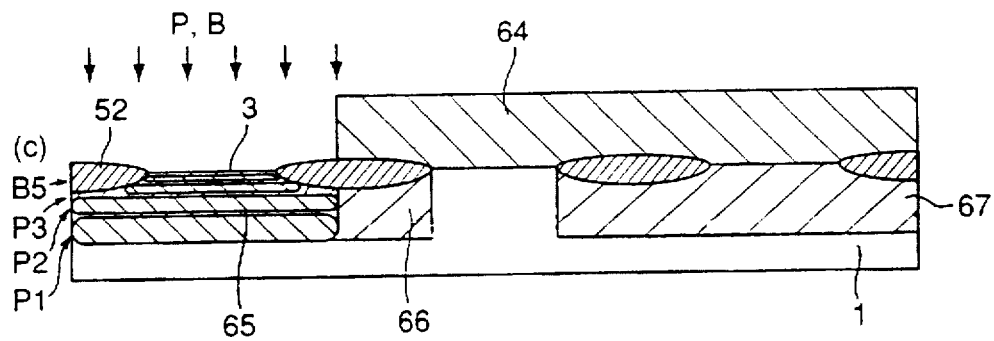

Thereafter, the resist pattern 63 was removed, and, as shown in FIG. 8(c), the resist pattern 64 having an opening in a PMOS transistor-forming region 60 (including a part of the device isolation region 52) was formed, and phosphorus ions and boron ions were implanted using this resist pattern 64 as a mask under the following conditions.

| | |
|---|---|
| P1 Phosphorus ions, | Implanting energy: 600 keV, Dosage: $3 \times 10^{13}$ cm$^{-2}$ |
| P2 Phosphorus ions, | Implanting energy: 230 keV: Dosage: $2 \times 10^{12}$ cm$^{-2}$ |
| P3 Phosphorus ions, | Implanting energy: 100 keV: Dosage: $1 \times 10^{12}$ cm$^{-2}$ |
| B5 Boron ions, | Implanting energy: 20 keV: Dosage: $3.3 \times 10^{12}$ cm$^{-2}$ |

Figure 8D:
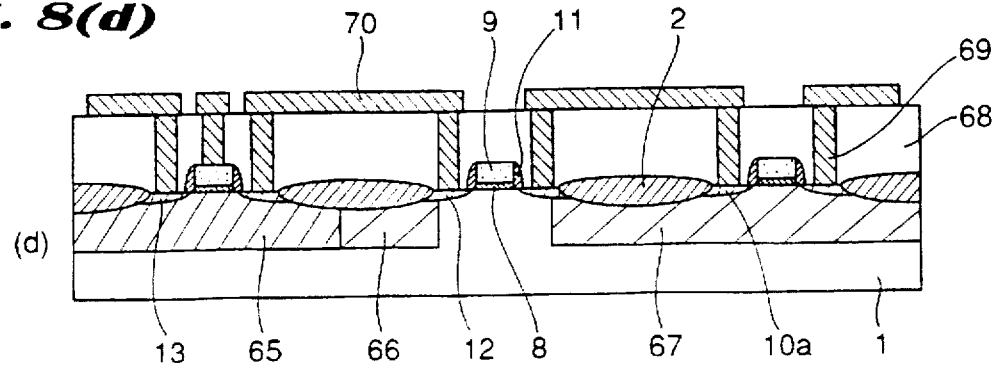
Figure 9A:
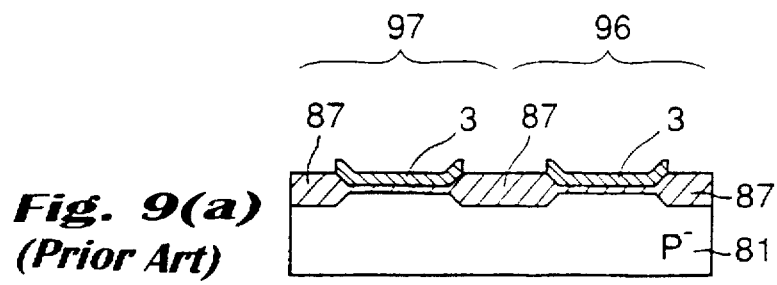
FIGS. 9(a) to 9(e) are schematic views of the process showing a method of manufacturing a prior-art semiconductor device.
Figure 9B:
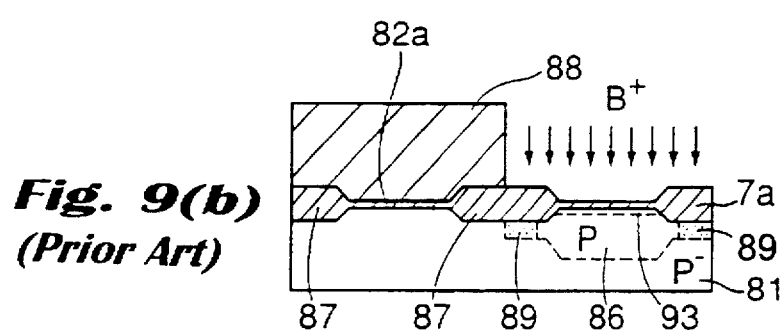
Figure 9C:
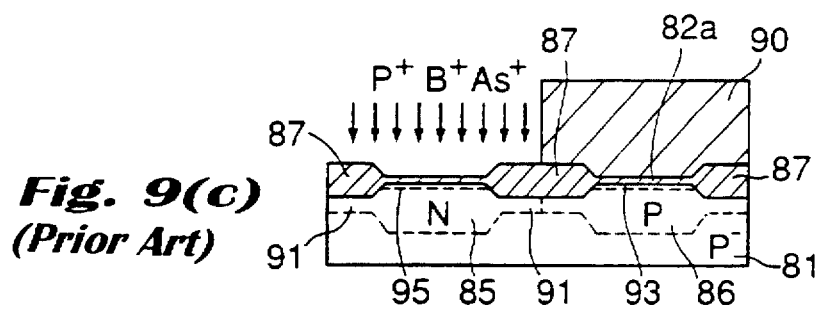
Figure 9D:
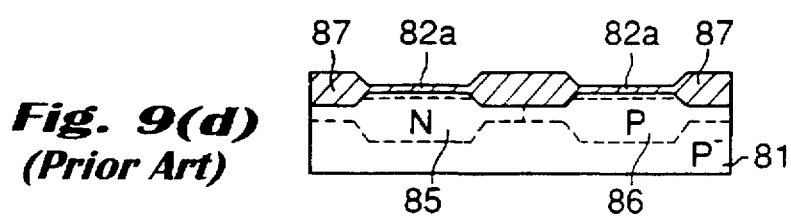
Figure 9E:
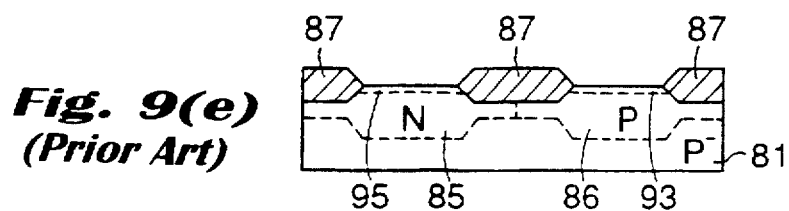
Figure 10A:
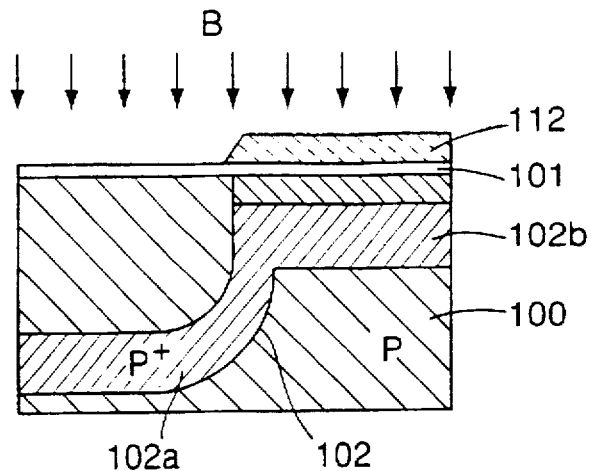
FIGS. 10(a) to 10(c) are schematic views of t he process showing a method of manufacturing another prior-art semiconductor device.
Figure 10B:
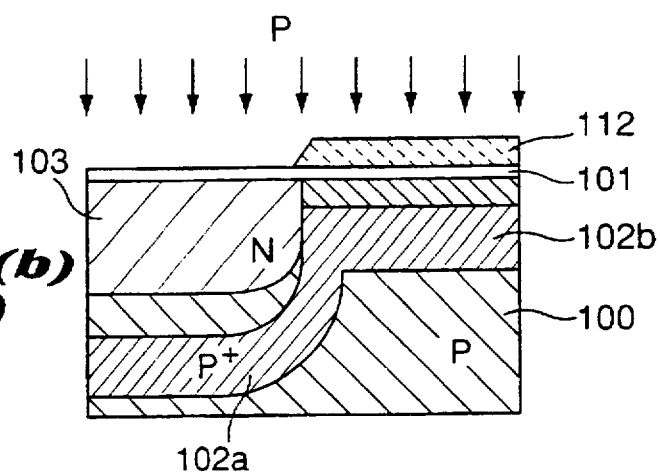
Figure 10C:
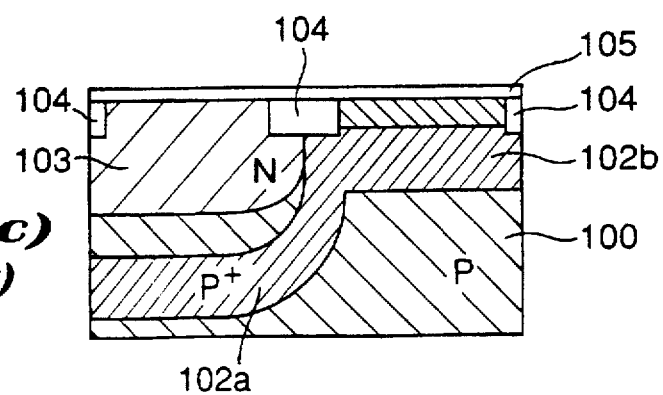
Figure 11A:
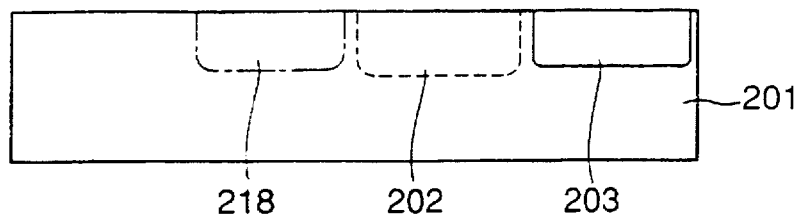
Figure 11B:
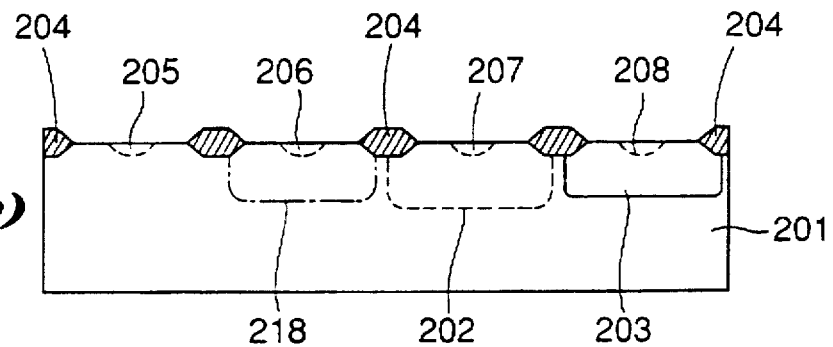
Figure 11C:
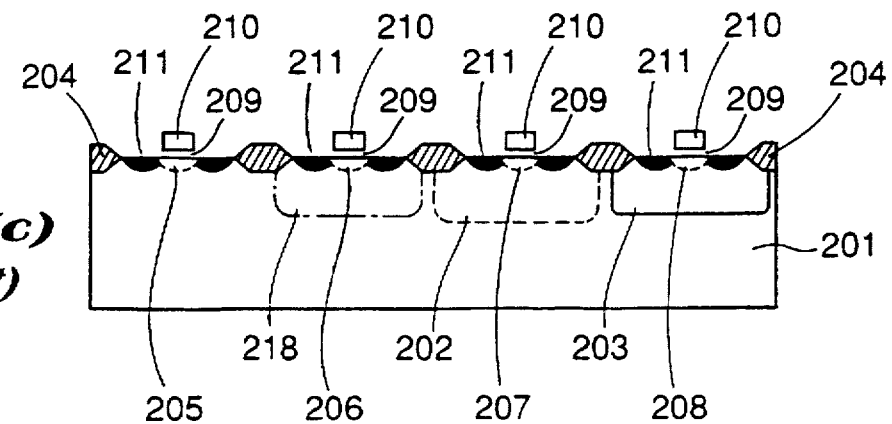

Then, as shown in FIG. 8(d), the MOS transistor was formed using known technique.

Namely, a gate electrode comprising an N$^+$ polysilicon 9 with a film thickness of about 1000 Å was formed on the active region of the silicon substrate 1 via a gate insulating film 8 with a film thickness of about 80 Å. Also, a side wall spacer 11 was formed on the side walls of these gate electrodes, and source/drain regions 12 and 13 were formed there. An interlayer insulating film 68 was formed on the gate electrode. The gate electrode and the source/drain regions 12 and 13 were connected to a metal wire 70 via a tungsten plug 69.

In this example, no intentional annealing to activate the wells was carried out. The impurity ions that formed the wells were automatically activated in the gate oxidizing step and in the step for annealing the interlayer insulating film formed on the transistor after completion of the transistor. Each of these thermal treatments was carried out at 900° C. for a short time. No remarkable diffusion of impurity ions occurred under such conditions.

When the thermal treatment was conducted at 1000° C for the minimum period of time required for the activation, lateral diffusion of impurity ions occurred in the boundary region of the N well and the P well, and impurity concentration in both wells was lowered. However, since the concentration of impurity ions was originally as low as about $10^{16}$ to $10^{18}$/cm$^3$, the diffusion fell within an alignment precision allowance (for example, 0.1 to 0.5 µm) for masks used for forming wells. But, in the region where impurity ions for forming wells have not been implanted, impurity ions diffuse from the adjacent wells by thermal treatment because the concentration of impurity ions in the region was as low as $10^{14}$ to $10^{15}$/cm$^3$. Accordingly, the circuit must be redesigned by widening the size of the circuit in compliance with the prolonged length of diffusion due to thermal treatment. Therefore, it is necessary to perform thermal treatment for a short time and at a low temperature.

Through the above-mentioned step, one set of CMOS transistors and one kind of MOS transistor having different threshold voltages could be formed, without increasing the number of masks and the area of the circuit.

According to the present invention, the first conductivity type impurity region (well) for forming a transistor on a semiconductor substrate is formed by four-step implantation, by which the following four controls can be achieved independently of each other and without increasing the number of the steps:

(1) the well resistance can be reduced, and the latchup tolerance can be increased;

(2) definite device isolation within wells can be assured;

(3) the punch-through of the transistor can be prevented; and (4) the threshold voltage of the transistor can be controlled.

Furthermore, the present invention also makes it possible to manufacture PMOS's and/or NMOS's having different threshold voltages, one set of CMOS's, and one kind of MOS's having different threshold voltages within the range for mask alignment precision; not to incur increases in manufacturing time and cost; and to realize the manufacture of integrated circuits with complicated circuit structures.

What we claim is:

1. A method of manufacturing a semiconductor device comprising forming a device isolation region in a semiconductor substrate;

forming at least a first conductivity type impurity region in the semiconductor substrate; and forming on the semiconductor substrate a transistor including a gate insulating film, a gate electrode, source/drain regions and a channel located directly under the gate electrode, wherein the first conductivity type impurity region is formed by the steps of:

an ion implantation 1 having a concentration peak at a location deeper than the bottom of the device isolation region;

an ion implantation 2 having a concentration peak at a location around the bottom of the device isolation region;

an ion implantation 3 having a concentration peak around the junction regions where the source/drain regions are to be formed; and an ion implantation 4 having a concentration peak on the surface or directly under the surface of the region where the channel is to be formed.

2. A method of manufacturing a semiconductor device according to claim 1, wherein the first conductivity type impurity region formed through the ion implantations 1 to 4 is activated simultaneously with the formation of the gate insulating film on the semiconductor substrate.

3. A method of manufacturing a semiconductor device comprising forming a device isolation region deeper than 0.6 µm in a first conductivity type semiconductor substrate;

forming at least a first conductivity type impurity region in the first conductivity type semiconductor substrate; and forming on the semiconductor substrate a transistor including a gate insulating film, a gate electrode, source/drain regions and a channel located directly under the gate electrode, wherein the first conductivity type impurity region is formed by the steps of:

an ion implantation 1' having a concentration peak around the depth of 0.6 µm;

an ion implantation 2' having a concentration peak around the depth of 0.35 µm;

an ion implantation 3' having a concentration peak around the junction regions where the source/drain regions are to be formed; and an ion implantation 4' having a concentration peak on the surface or directly under the surface of the region where the channel is to be formed.

4. A method of manufacturing a semiconductor device according to claim 3, wherein the first conductivity type impurity region formed through the ion implantations 1' to 4' is activated simultaneously with the formation of the gate insulating film on the semiconductor substrate.

5. A method of manufacturing a semiconductor device comprising:

forming a device isolation region in a semiconductor substrate;

forming plural first conductivity type impurity regions having different impurity concentrations in the semiconductor substrate; and forming on the semiconductor substrate plural transistors each having a different threshold voltage and including a gate insulating film, a gate electrode, source/drain regions and a channel located directly under the gate electrode, wherein the plural first conductivity type impurity regions having different impurity concentrations are formed by the steps of:

forming a mask pattern on the semiconductor substrate, the mask pattern having an opening at least in a transistor-forming region where a transistor having threshold voltage of a first absolute value is to be formed;

implanting first conductivity type impurity ions selectively into the transistor-forming region using the mask pattern formed by the steps of:

an ion implantation 1 having a concentration peak at a location deeper than the bottom of the device isolation region;

an ion implantation 2 having a concentration peak at a location around the bottom of the device isolation region;

an ion implantation 3 having a concentration peak around the junction regions where the source/drain regions are to be formed; and an ion implantation 4 having a concentration peak on the surface or directly under the surface of the region where the channel is to be formed; and implanting first conductivity type impurity ions by ion implantation 5 that allows ions to penetrate through the mask pattern into the transistor-forming region which is covered with the mask pattern and in which a transistor having threshold voltage of a second absolute value which is smaller than the first absolute value is to be formed.

6. A method of manufacturing a semiconductor device according to claim 5, wherein the mask pattern has an opening that reaches an outer circumference of the transistor-forming region where a transistor having threshold voltage of the second absolute value is to be formed.

7. A method of manufacturing a semiconductor device, comprising:

forming a device isolation region in a semiconductor substrate;

forming plural first conductivity type impurity regions having different impurity concentrations in the semiconductor substrate; and forming on the semiconductor substrate plural transistors each having a different threshold voltage and including a gate insulating film, a gate electrode, source/drain regions and a channel located directly under the gate electrode, wherein the plural first conductivity type impurity regions having different impurity concentrations are formed by the steps of:

forming a mask pattern on the semiconductor substrate, the mask pattern having an opening at least in a transistor-forming region where a transistor having a threshold voltage of a first absolute value is to be formed;

implanting first conductivity type impurity ions selectively into the transistor-forming region by means of the mask pattern formed by the steps of:

an ion implantation 1' having a concentration peak around the depth of 0.6 µm;

an ion implantation 2' having a concentration peak around the depth of 0.35 µm;

an ion implantation 3' having a concentration peak around the junction regions where the source/drain regions are to be formed; and an ion implantation 4' having a concentration peak on the surface or directly under the surface of the region where the channel is to be formed; and implanting first conductivity type impurity ions by ion implantation 5 that allows ions to penetrate through the mask pattern into the transistor-forming region which is covered with the mask pattern and in which a transistor having a threshold voltage of a second absolute value which is smaller than the first absolute value is to be formed.

8. A method of manufacturing a semiconductor device according to claim 7, wherein the mask pattern has an opening that reaches an outer circumference of the transistor-forming region where a transistor having threshold voltage of the second absolute value is to be formed.

* * * * *